(12) United States Patent
Yasunishi et al.

(10) Patent No.: US 10,381,150 B2
(45) Date of Patent: Aug. 13, 2019

(54) NOISE SUPPRESSION MEMBER

(71) Applicant: KITAGAWA INDUSTRIES CO., LTD., Aichi (JP)

(72) Inventors: Yuki Yasunishi, Aichi (JP); Tatsuya Nakamura, Aichi (JP)

(73) Assignee: Kitagawa Industries Co., Ltd., Aichi (JP)

( * ) Notice: Subject to any disclaimer, the term of this patent is extended or adjusted under 35 U.S.C. 154(b) by 36 days.

(21) Appl. No.: 15/737,476

(22) PCT Filed: Jun. 15, 2016

(86) PCT No.: PCT/JP2016/067834
§ 371 (c)(1),
(2) Date: Dec. 18, 2017

(87) PCT Pub. No.: WO2016/204188
PCT Pub. Date: Dec. 22, 2016

(65) Prior Publication Data
US 2018/0158590 A1    Jun. 7, 2018

(30) Foreign Application Priority Data
Jun. 19, 2015   (JP) ................................ 2015-123872

(51) Int. Cl.
*H01F 17/06*   (2006.01)
*H01F 27/26*   (2006.01)
(Continued)

(52) U.S. Cl.
CPC ........... *H01F 27/263* (2013.01); *H01F 17/06* (2013.01); *H01F 27/02* (2013.01); *H05K 9/00* (2013.01); *H01F 2017/065* (2013.01)

(58) Field of Classification Search
CPC .... H01F 27/00–36; H01F 27/17; H01F 27/06; H01F 38/20
(Continued)

(56) References Cited

U.S. PATENT DOCUMENTS 5,900,796 A  *  5/1999  Parker ..................... H01F 17/06
                                                    174/92
7,319,376 B2 *  1/2008  Kobayashi ............. H01F 17/06
                                                    336/175
2016/0343496 A1  11/2016  Mukuno et al.

FOREIGN PATENT DOCUMENTS

JP   U1988027094   2/1988
JP   3045426       11/1997
(Continued)

OTHER PUBLICATIONS

International Preliminary Report on Patentability, issued by the International Bureau in Application No. PCT/JP2016/067834 dated Dec. 19, 2017 (Global Dossier date).
(Continued)

*Primary Examiner* — Tuyen T Nguyen
(74) *Attorney, Agent, or Firm* — Meunier Carlin & Curfman LLC

(57) ABSTRACT

A noise suppression member according to one aspect of the present disclosure includes: a first core part and a second core part; and a first case part and a second case part. The first case part and the second case part are provided with engagement mechanisms. The engagement mechanisms each include an engaging portion and an engaged portion and is configured to fix the first case part and the second case part by engaging the engaging portions with the respective engaged portions. When the first case part and the second case part are fixed with the engagement mechanisms, the first core part and the second core part are maintained in a state of forming an annular magnetic core. When the engag-
(Continued)

ing portion engages with the engaged portion, the first core part and the second core part are configured to come into contact with each other.

4 Claims, 4 Drawing Sheets

(51) Int. Cl.
  *H05K 9/00* (2006.01)
  *H01F 27/02* (2006.01)
(58) Field of Classification Search
  USPC .............................. 336/65, 90, 92, 174–175
  See application file for complete search history.

(56) References Cited

FOREIGN PATENT DOCUMENTS

| JP | 2003198177 | 7/2003 |
| JP | 2006-005888 A | 1/2006 |
| JP | 2015154040 A | 8/2015 |
| WO | 2013/145586 A1 | 10/2013 |
| WO | 2014/046194 A1 | 3/2014 |
| WO | 2014/208317 A1 | 12/2014 |
| WO | 2015125639 A1 | 8/2015 |

OTHER PUBLICATIONS

International Search Report dated Aug. 30, 2016, from International Application No. PCT/JP2016/067834, 2 pages.
Form PCT/IPEA/409 dated Jul. 4, 2017, from International Application No. PCT/JP2016/067834, 4 pages (non-English).
Form PCT/IB/338 and English Translation of Form PCT/IPEA/409 dated Dec. 21, 2017, from International Application No. PCT/JP2016/067834, 7 pages.
Notification of Reasons for Refusal, dated Feb. 12, 2019 in corresponding Japanese Patent Application No. 2015-123872 (English machine translation obtained from Grobal Dossier).

* cited by examiner

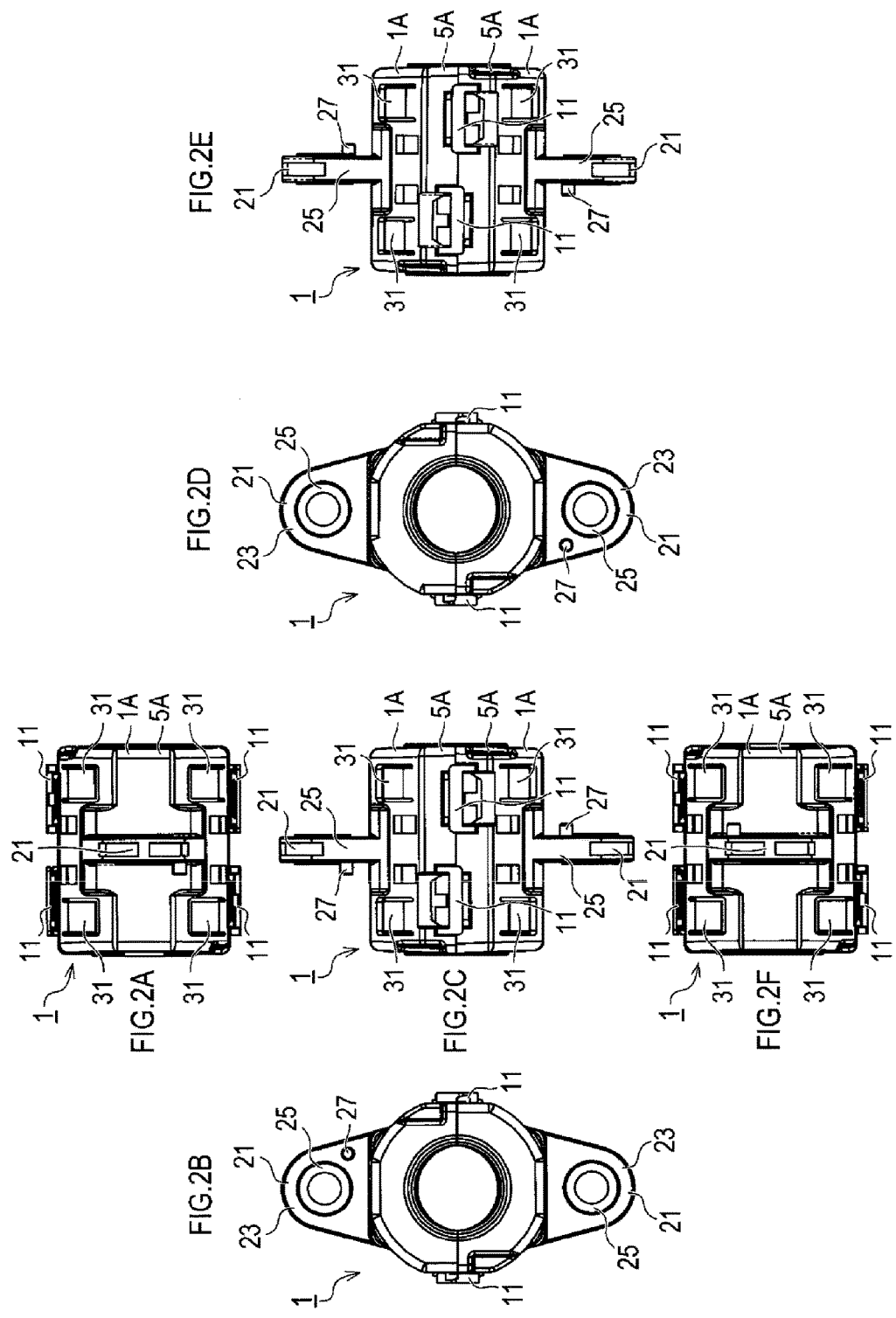

NOISE SUPPRESSION MEMBER

CROSS-REFERENCE TO RELATED APPLICATION

This international application claims priority to Japanese Patent Application No. 2015-123872, filed to Japan Patent Office on Jun. 19, 2015, and the total contents of Japanese Patent Application No. 2015-123872 are hereby incorporated by reference.

TECHNICAL FIELD

The present invention relates to a noise suppression member.

BACKGROUND ART

A noise suppression member is known that is attached to an electric wire to attenuate noise current and that includes a first core part, a second core part, a first case part, and a second case part (for example, see Patent Document 1). The first core part and the second core part are brought into contact with each other to form an annular magnetic core. With the first core part and the second core part forming the annular magnetic core, the first case part and the second case part hold the first core part and the second core part.

In the noise suppression member described in Patent Document 1 below (referred to as "noise absorption member" in Patent Document 1), the first case part stores the first core part, and the second case part stores the second core part. The first case part and the second case part are each provided with a snap-fit engagement mechanism including a resilient latch piece. The resilient latch piece engages with an engaged portion to allow the engagement mechanism to be in an engaging state. When the engagement mechanism is in the engaging state, the first case part and the second case part are fixed to each other.

CITATION LIST

Patent Literature

Patent Document 1: Japanese Utility Model Registration No. 3,045,426

SUMMARY OF INVENTION

Technical Problem

The above-described noise suppression member is configured such that, when the resilient latch piece reaches a position for engaging with the engaged portion to allow the engagement mechanism to be in the engaging state, the first core part and the second core part come into contact with each other. Furthermore, the above-described noise suppression member is configured such that, in order to prevent the engaging state of the engagement mechanism from being released by being acted on by a certain degree of external force, the resilient latch piece does not deform until a greater degree of force than the certain degree is applied.

With the above-described structure, until the engagement mechanism is brought into the engaging state, resistance preventing the engagement mechanism from being brought into the engaging state is produced. However, when the engagement mechanism is brought into the engaging state, the resistance then decreases sharply. In particular, with a structure in which the resilient latch piece engages with the engaged portion very securely, such resistance increases. This structure increases a difference between a maximum resistance and the resistance after the sharp decrease.

Thus, in a case where a worker applies force great enough to exceed the resistance to bring the engagement mechanism into the engaging state, the resistance then decreases sharply as described above, and the force from the worker is all applied to the first core part and the second core part. This causes the first core part and the second core part to strongly collide with each other. As a result, the impact of the collision between the first core part and the second core part is transmitted to fingers of the worker, and an excess load is applied to the worker.

Furthermore, sound produced when the first core part and the second core part collide with each other (hereinafter referred to as "collision sound") and sound produced when the engagement mechanism is brought into the engaging state (hereinafter referred to as "engagement sound") are produced substantially simultaneously. Thus, even in a case where the worker desires to confirm that the engagement mechanism is surely in the engaging state by hearing the engagement sound, the worker cannot easily determine whether the worker heard: only the collision sound of the first core part and the second core part; or the engagement sound of the engagement mechanism together with the collision sound of the first core part and the second core part.

In one aspect of the present disclosure, it is desirable to provide a noise suppression member that can reduce impact produced when an engagement mechanism is brought into an engaging state, and that facilitates easy confirmation of the collision sound.

Solution to Problem

A noise suppression member according to one aspect of the present disclosure includes: a first core part and a second core part; and a first case part and a second case part. The first core part and the second core part are configured to form an annular magnetic core by bringing the first core part and the second core part into contact with each other. The first case part is configured to be able to house the first core part, and the second case part is configured to be able to house the second core part. The first case part and the second case part include engagement mechanisms. The engagement mechanisms each include an engaging portion and an engaged portion and are configured to be able to fix the first case part and the second case part to each other by engaging the engaging portion with the engaged portion to bring the engagement mechanisms into an engaging state. Upon fixing the first case part and the second case part to each other with the engagement mechanisms, the first case part and the second case part are configured to maintain the first core part and the second core part in a state of forming the annular magnetic core, and the annular magnetic core is configured such that an electric wire is held in inner peripheral side of the annular magnetic core. When bringing the engagement mechanisms into the engaging state, the first core part and the second core part are configured to come into contact with each other before the engagement mechanisms are brought into the engaging state, and the engagement mechanisms are configured to be brought into the engaging state after the first core part and the second core part come into contact with each other.

In the noise suppression member thus configured, when the engagement mechanisms are brought into the engaging state, the first core part and the second core part come into contact with each other before the engagement mechanisms are brought into the engaging state. Thus, at this time, resistance preventing the engagement mechanisms from being brought into the engaging state is applied. This resistance can prevent the first core part and the second core part from strongly colliding with each other. Thus, impact due to contact between the first core part and the second core part can be reduced. After the first core part and the second core part come into contact with each other, the engagement mechanisms are brought into the engaging state. In this stage, the first core part and the second core part are already in contact with each other. Unlike a configuration in which the first core part and the second core part collide with each other in this stage, great impact is not produced in this configuration.

Thus, even in the case where a worker brings the engagement mechanism into the engaging state with a greater degree of force than a certain degree, no strong impact is transmitted to fingers of the worker. Accordingly, an excess load on the worker can be reduced.

Collision sound produced when the first core part and the second core part come into contact with each other and engagement sound produced when the engagement mechanisms are brought into the engaging state are produced at different times. Thus, in the case where a worker desires to confirm that the engagement mechanisms are surely in the engaging state with sound, the worker need only to confirm whether the engagement sound is heard from the engagement mechanisms after the collision sound of the first core part and the second core part is heard. This can facilitate confirmation of whether the engaging state is achieved with sound.

BRIEF DESCRIPTION OF DRAWINGS

FIG. 2A is a plan view of the noise suppression member. FIG. 2B is a left-side view of the noise suppression member. FIG. 2C is a front view of the noise suppression member. FIG. 2D is a right-side view of the noise suppression member. FIG. 2E is a rear view of the noise suppression member. FIG. 2F is a bottom view of the noise suppression member.

REFERENCE SIGNS LIST

Figure 1A:
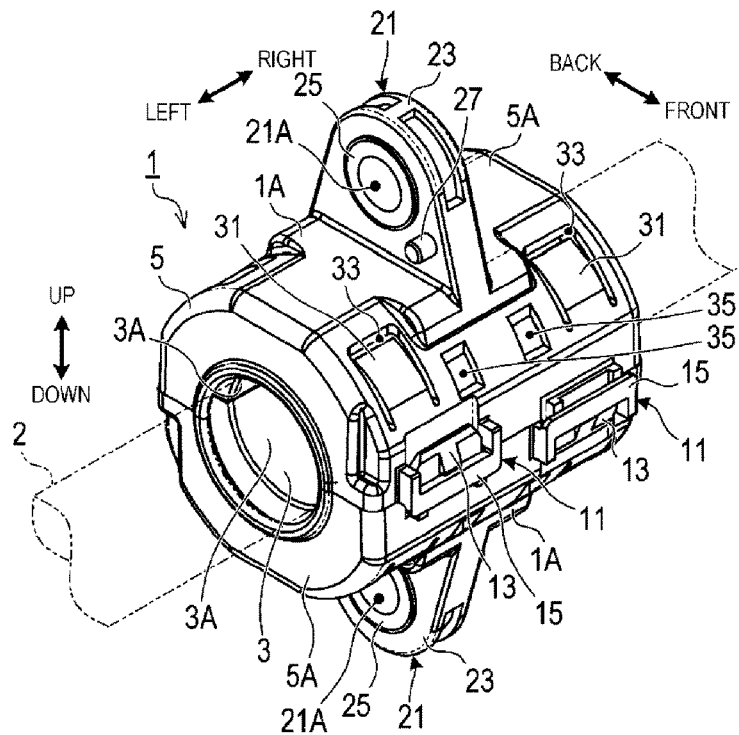
FIG. 1A is a perspective view of a noise suppression member.

1 Noise suppression member
1A Divided part
2 Electric wire
3 Magnetic core
3A Core part
5 Case
5A Case part
11 Engagement mechanism
13 Engaging portion
15 Engaged portion
21 Fixing portion
21A Through-hole
23 Resin portion
25 Metal portion
27 Boss
31 Resilient pressing piece
33 Hole
35 Hole
37 Concave portion
39 Claw
41 Fixing tool
43 Fixing target place
45 Hole
A1 First region
A2 Second region
A3 Third region

DESCRIPTION OF EMBODIMENTS

Next, an exemplary embodiment of the noise suppression member described above will be explained. Note that up-down, left-right, and front-back directions indicated in the drawings are used in the following description when necessary. However, it should be understood that these directions are defined only for the purpose of facilitating the description of the relative positional relationships of constituents of the noise suppression member. When actually used, the noise suppression member may be oriented in any direction. For example, the noise suppression member may be used in a state in which the up-down direction indicated in the drawings does not coincide with the vertical direction due to the relationship of the up-down direction with gravity.

Figure 1B:
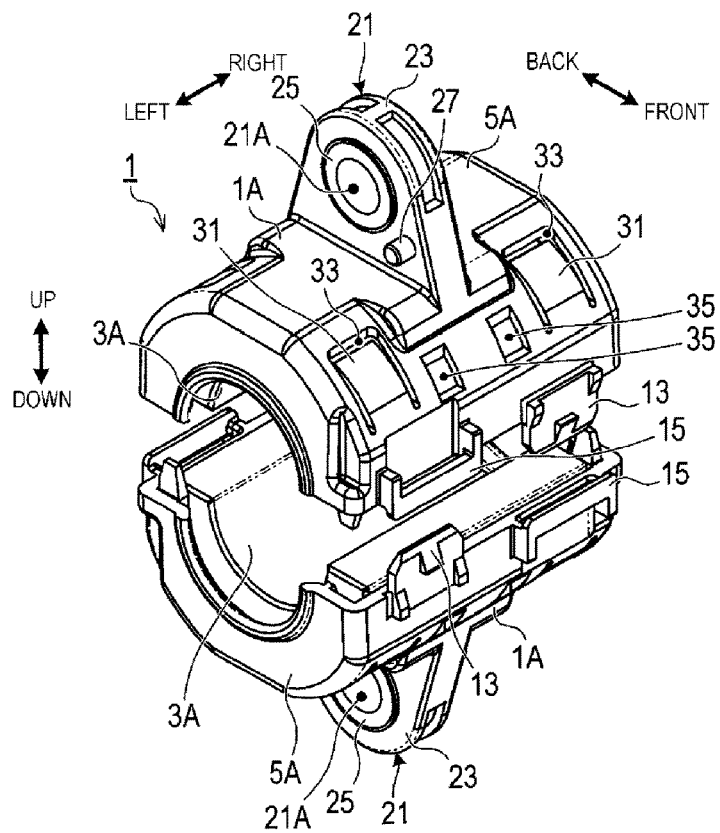
FIG. 1B is an exploded view of the noise suppression member.

As illustrated in FIGS. 1A and 1B, the noise suppression member 1 is attached to the outer periphery of an electric wire 2 to attenuate noise current flowing in the electric wire 2. The noise suppression member 1 includes a magnetic core 3 and a case 5. The magnetic core 3 is made from ferrite. The case 5 is made from polyamide resin. The magnetic core 3 has an annular shape. The case 5 is configured to house the magnetic core 3. The magnetic core 3 is composed of two core parts 3A, 3A. The two core parts 3A, 3A have the same shape. One of the core parts 3A exemplifies a first core part of the present disclosure, and the other core part 3A exemplifies a second core part of the present disclosure. The case 5 is composed of two case parts 5A, 5A. The two case parts 5A, 5A have the same shape. One of the case parts 5A exemplifies a first case part of the present disclosure, and the other case part 5A exemplifies a second case part of the present disclosure. The one case part 5A stores the one core part 3A, and the other case part 5A stores the other core part 3A. This provides two divided parts 1A, 1A having the same structure.

As illustrated in FIGS. 2A to 2F, the case 5 is provided with four engagement mechanisms 11. The engagement mechanisms 11 each include an engaging portion 13 and an engaged portion 15 configured to engage with the engaging portion 13. The case parts 5A are each provided with two engaging portions 13, 13 and two engaged portions 15, 15. To fix the two divided parts 1A, 1A to each other, the four engaging portions 13 engage with the four engaged portions 15. Engagement of the engaging portion 13 with the engaged portion 15 allows the engagement mechanism 11 to be brought into an engaging state.

When the two divided parts 1A, 1A are fixed to each other, the two core parts 3A, 3A form the annular magnetic core 3.

The two core parts 3A, 3A are held by the two case parts 5A, 5A. This configuration enables the electric wire 2 to be placed on the inner periphery side of the magnetic core 3. When the electric wire 2 is placed on the inner periphery side of the magnetic core 3, the electric wire 2 may be arranged between the two divided parts 1A, 1A in a divided state, and then the two divided parts 1A, 1A may be fixed to each other. Alternatively, the two divided parts 1A, 1A in a divided state may be fixed to each other, and then the electric wire 2 may be inserted.

The case parts 5A are each provided with a fixing portion 21 having a through-hole 21A. The fixing portion 21 includes a resin portion 23 and a metal portion 25. The resin portion 23 is formed integrally with the case part 5A. The metal portion 25 is fixed to the resin portion 23. In the present embodiment, the metal portion 25 is composed of a tube-shaped metal collar made from steel. The metal collar defines the above-described through-hole 21A, thereby providing a configuration in which the through-hole 21A is defined in the metal portion 25.

The resin portion 23 of the fixing portion 21 is provided with a boss 27. The boss 27 has a columnar shape and protrudes in the same direction as a penetrating direction of the through-hole 21A.

The case parts 5A are each provided with four resilient pressing pieces 31, 31, 31, 31. The case parts 5A are each provided with four holes 33, 33, 33, 33 positioned surrounding three sides of the respective resilient pressing pieces 31. The resilient pressing pieces 31 are each provided continuing from the case part 5A at an end that is not surrounded by the hole 33. The case parts 5A are each further provided with four holes 35, 35, 35, 35.

Figure 3:
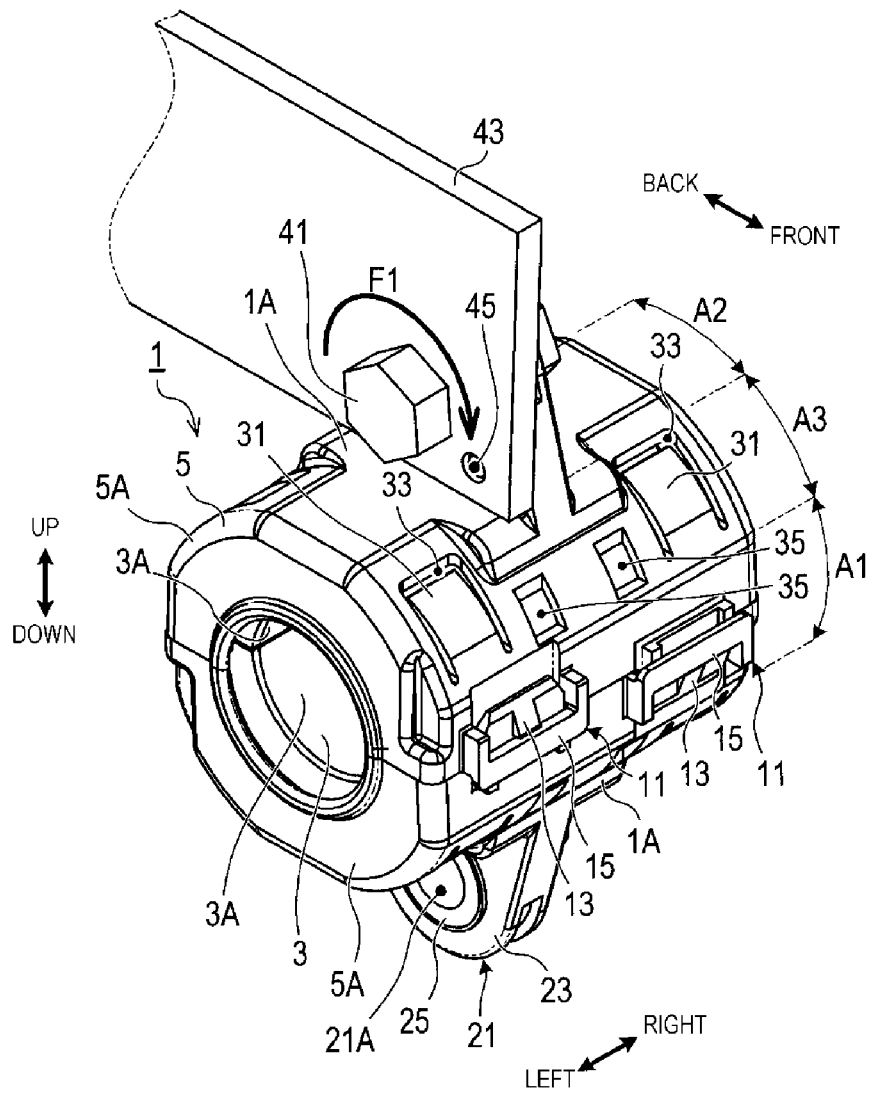
FIG. 3 is a perspective view of a state in which the noise suppression member is attached to an attachment target place, such as a stay.

As illustrated in FIG. 3, the noise suppression member 1 thus configured can be fixed to a fixing target place 43 (a stay composed of a metal plate in the present embodiment) with a fixing tool 41 (a bolt and nut in the present embodiment). That is, a shaft portion (not illustrated) of the fixing tool 41 is inserted into the through-hole 21A of the fixing portion 21, and the fixing tool 41 and the noise suppression member 1 can be fixed to the fixing target place 43.

Thus, unlike a noise suppression member 1 that is not provided with the above-described fixing portions 21, the noise suppression member 1 can be easily fixed to the fixing target place 43. Furthermore, unlike a noise suppression member 1 that is not fixed to a fixing target place other than an electric wire 2, the state in which the noise suppression member 1 is arranged in the vicinity of the fixing target place can be stably maintained.

In the present embodiment, the through-hole 21A is defined in the metal portion 25. This configuration can improve resistance to wear on the inner peripheral surface of the through-hole 21A and rigidity in the vicinity of the through-hole 21A compared to a case where a through-hole 21A is defined in a resin portion. Accordingly, even in a case where the fixing tool 41 has a metal shaft portion, wear on the inner peripheral surface of the through-hole 21A due to friction against the shaft portion can be reduced compare to a case where the through-hole 21A is defined in a resin portion. Furthermore, deformation of the inner peripheral surface of the through-hole 21A due to force received from the shaft portion can be reduced.

The fixing target place 43 is provided with a hole (not illustrated) for passing a shaft portion of the fixing tool 41 therethrough and a hole 45 for inserting the boss 27 thereinto. Thus, when the noise suppression member 1 is fixed to the fixing target place 43, rough positioning can be performed by, for example, first inserting the boss 27 into the hole 45. Then, the noise suppression member 1 is rotated about the boss 27 to match the position of the through-hole 21A of the fixing portion 21 with the position of the hole of the fixing target place 43. Thereafter, the shaft portion of the fixing tool 41 is inserted to achieve appropriate relative positioning of the noise suppression member 1 and the fixing target place 43.

Alternatively, the noise suppression member 1 may be fixed to the fixing target place 43 by a different process. For example, the shaft portion of the fixing tool 41 may be first inserted into the through-hole 21A of the fixing portion 21 and the hole of the fixing target place 43 for rough positioning. In this case, the noise suppression member 1 is rotated about the shaft portion of the fixing tool 41 to a position where the boss 27 fits in the hole 45 to achieve appropriate relative positioning of the noise suppression member 1 and the fixing target place 43.

Thus, workability in fixing the noise suppression member 1 in an appropriate position is improved by either processes of achieving appropriate relative positioning of the noise suppression member 1 and the fixing target place 43, compared to a case where the boss 27 is not provided.

When the noise suppression member 1 is fixed to the fixing target place 43, torque is applied to the fixing tool 41 in the direction indicated by arrow F1 in FIG. 3. At this time, torque may also be applied temporarily to the fixing portion 21 in the same direction. In this case, the boss 27 receives the torque, so that an excess load on the engagement mechanism 11 can be avoided. This configuration can reduce distortion in the vicinity of the engagement mechanisms 11 in fastening the fixing tool 41, compared to a case where the boss 27 is not provided. The engagement mechanisms 11 can thus function as designed. Accordingly, a gap and a shift in a contact position between the one core part 3A and the other core part 3A can be reduced. Impedance characteristics of the magnetic core 3 can thus be stabilized and ensured.

In the present embodiment, the case parts 5A each have a first region A1, a second region A2, and a third region A3 in the circumferential direction about an axis being an inserting direction of the electric wire 2, as illustrated in FIG. 3. The engagement mechanisms 11 are disposed in the first region A1 among these regions. The fixing portion 21 is disposed in the second region A2. The third region A3 is in between the first region A1 and the second region A2. The above-described holes 33 and holes 35 are defined in the third region A3. Thus, the case parts 5A are each configured such that the third region A3 is less rigid than the first region A1 and the second region A2.

In the case where torque is applied in the direction indicated by arrow F1 in FIG. 3, when torque is also applied to the fixing portion 21 in the same direction, and when a load is applied on the case part 5A, this configuration allows the less rigid third region A3 of the case part 5A to more readily deform. This configuration has an effect of reducing deformation in the second region A2 and can thus also reduce distortion in the vicinity of the engagement mechanisms 11. The engagement mechanisms 11 can thus function as designed, and formation of a gap between the one core part 3A and the other core part 3A can be reduced. Furthermore, a shift in the contact position between the one core part 3A and the other core part 3A can be reduced. Impedance characteristics of the magnetic core 3 can thus be stabilized and ensured.

Even by using only one of the above-described boss 27 and the above-described less rigid third region A3, effect of reducing distortion in the vicinity of the engagement mechanisms 11 can be suitably achieved. Thus, in a case where torque applied to the fixing portion 21 is assumed not to be excessive, only one of the above-described boss 27 and the above-described less rigid third region A3 may be used. In a case where torque applied to the fixing portion 21 is likely to be excessive, it is preferable that both the above-described boss 27 and the above-described less rigid third region A3 are used.

As illustrated in FIGS. 4A to 4D, the core parts 3A are provided with concave portions 37, and the case parts 5A are provided with claws 39. The claws 39 hook onto the concave portions 37, so that the core parts 3A housed in the case parts 5A do not fall off from the case parts 5A.

Figure 4A:
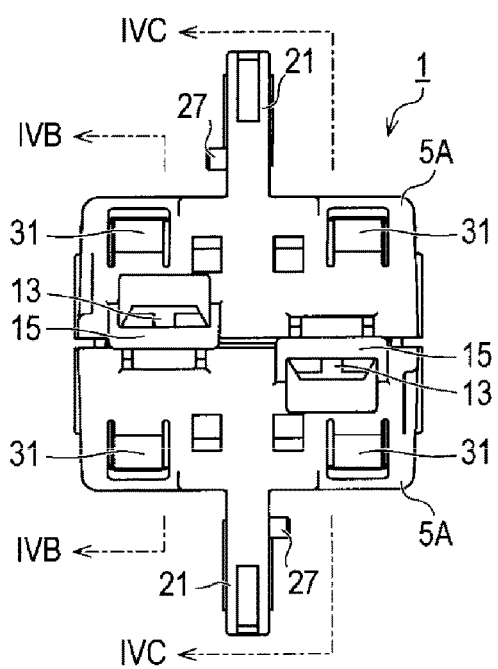
FIG. 4A is a front view of the noise suppression member in which two core parts come into contact with each other before engagement mechanisms are in an engaging state.
Figure 4B:
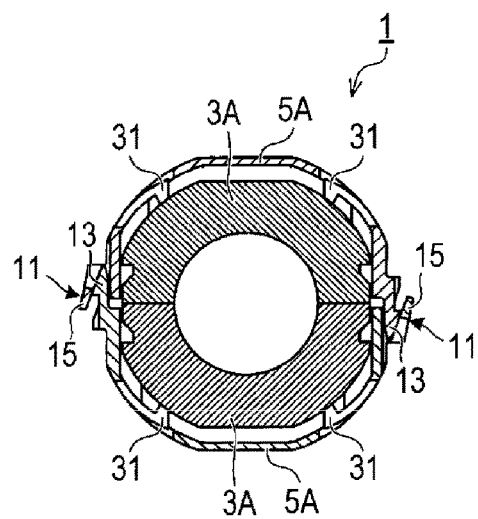
FIG. 4B is a cross-sectional view of a cut location indicated by line IVB-IVB in FIG. 4A.
Figure 4C:
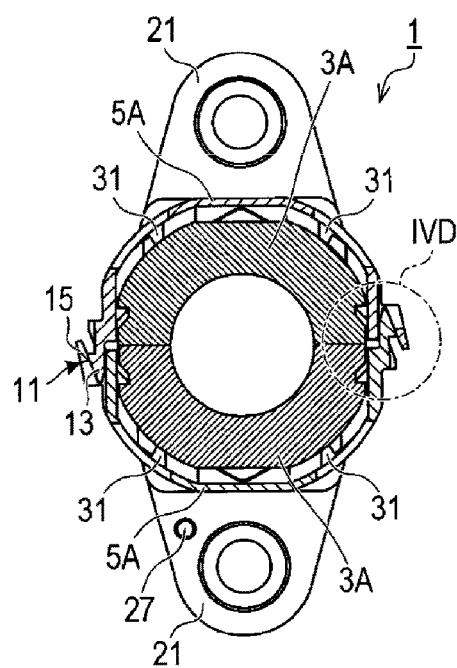
FIG. 4C is a cross-sectional view of a cut location indicated by line IVC-IVC in FIG. 4A.

Space for allowance is provided in the vicinities of the claws 39 in the concave portions 37. The core parts 3A can shift in positions with respect to the case parts 5A within the range of this allowance. As illustrated in FIGS. 4A, 4B, and the like, the above-described resilient pressing pieces 31 come into contact with the core parts 3A. Thus, the two core parts 3A, 3A are maintained in a state of shifted in positions in mutually approaching directions within the range of the above-described allowance.

Figure 4D:
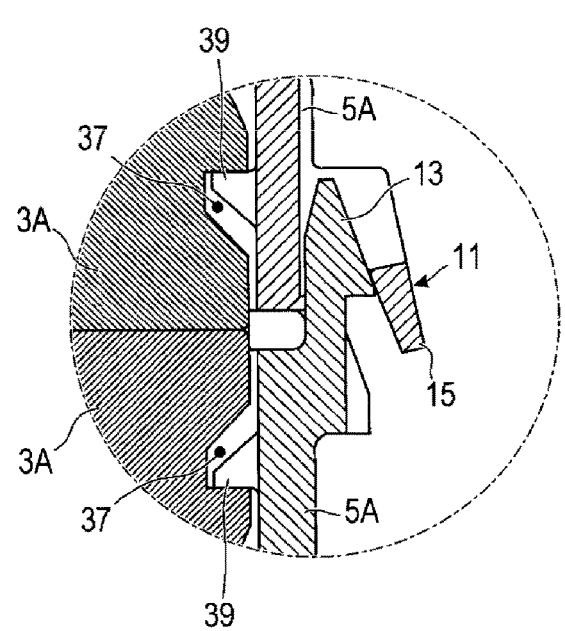
FIG. 4D is an enlarged cross-sectional view of a portion indicated by symbol IVD in FIG. 4C.

With the above-described configuration, when the engagement mechanisms 11 are brought into an engaging state, the one core part 3A and the other core part 3A come into contact with each other before the engaging portions 13 engage with the engaged portions 15 as illustrated in FIG. 4D. Then, the divided parts 1A, 1A are pressed against each other from this state, and the two core parts 3A, 3A do not shift in positions from the positions in which they are in contact with each other. However, the resilient pressing pieces 31 resiliently deform, so that the two case parts 5A, 5A shift in positions, and the engagement mechanisms 11 are thus brought into the engaging state.

When the two core parts 3A, 3A come into contact with each other, the engaging portions 13 shift in positions while resiliently deforming the engaged portions 15 as illustrated in FIG. 4D. Resistance preventing the engagement mechanisms 11 from being brought into the engaging state acts in between the engaging portions 13 and the engaged portions 15. Thus, unlike a case in which the core parts 3A, 3A come into contact with each other immediately after such resistance is lost, strong collision can be prevented between the one core part 3A and the other core part 3A. Impact due to contact between the one core part 3A and the other core part 3A can be reduced.

After the one core part 3A and the other core part 3A come into contact with each other, the engagement mechanisms 11 are brought into the engaging state. In this stage, the one core part 3A and the other core part 3A are already in contact with each other. This configuration does not produce great impact, unlike a noise suppression member having a structure in which the two core parts 3A, 3A collide with each other in this stage.

Thus, even in the case where a worker brings the engagement mechanisms 11 into the engaging state with a greater degree of force than a certain degree, no strong impact due to contact between the core parts 3A, 3A is transmitted to fingers of the worker. Accordingly, an excess load on the worker can be reduced.

Collision sound produced when the one core part 3A and the other core part 3A come into contact with each other and engagement sound produced when the engagement mechanisms 11 are brought into an engaging state are produced at different times. Thus, in the case where a worker desires to confirm that the engagement mechanisms 11 are surely in the engaging state with sound, the worker need only to check whether the engagement sound is heard from the engagement mechanisms 11 after the collision sound of the core parts 3A, 3A is heard, and the engaging state can easily be confirmed with sound.

An exemplary embodiment has been used to describe the noise suppression member, but the above-described embodiment should not be construed to be any more than an example of one form of the present invention. In other words, the present invention is not limited to the above-described exemplary embodiment. The present invention can be embodied in various forms without departing from the technical concept of the present invention.

For example, the four engagement mechanisms 11 are provided in the above-described embodiment; however, a structure corresponding to the engagement mechanism 11 may be provided in any number. The two fixing portions 21 are provided in the above-described embodiment; however, a structure corresponding to the fixing portion 21 may be provided in any number.

The above-described embodiment has exemplified a configuration where the case 5 is made from polyamide resin; however, the case 5 may be made from other resin material. Examples of the other resin material include ABS resin, polypropylene resin, and various engineering plastics. The metal portions 25 are composed of metal collars made from steel in the above-described example; however, metal material other than steel may be used.

Note that the electric wire 2 is exemplified as an object to which the noise suppression member 1 is attached in the above-described embodiment; however, this electric wire 2 may be either of a power line and a communication line. The above-described noise suppression member 1 can be attached to any object in which noise current may propagate.

Note that as is clear from the exemplary embodiment described above, the noise suppression member described in the present specification may be have configurations such as those given below.

In the noise suppression member described in the present specification, at least one of the case parts may be provided with the fixing portion having the through-hole into which a shaft portion of a fixing tool is inserted when the noise suppression member is fixed to a fixing target place with the fixing tool.

The noise suppression member described in the present specification may be configured to be fixed to a fixing target place with a fixing tool, and at least one of the first case part and the second case part may be provided with the fixing portion having the through-hole. The fixing tool may be provided with a shaft portion that is to be inserted into the through-hole.

According to the noise suppression member thus configured, the shaft portion of the fixing tool is inserted into the through-hole of the fixing portion, and the fixing tool and the noise suppression member can be fixed to the fixing target place with the fixing tool. Thus, unlike a noise suppression member that is not provided with the above-described fixing portion, the noise suppression member can be easily fixed to the fixing target place with the fixing tool (such as a screw, a bolt, a rivet, and a pin) having a shaft portion. Furthermore, unlike a noise suppression member that is not fixed to a fixing target place other than an electric wire, the state in which the noise suppression member is arranged in the vicinity of the fixing target place can be stably maintained.

In the noise suppression member described in the present specification, the fixing portion may include a resin portion and a metal portion, the resin portion may be formed integrally with the case part, the metal portion may be fixed to the resin portion, and a through-hole may be defined in the metal portion.

According to the noise suppression member thus configured, the through-hole is defined in the metal portion. This configuration can improve resistance to wear on the inner peripheral surface of the through-hole and rigidity in the vicinity of the through-hole compared to a case where a through-hole is defined in a resin portion. Accordingly, even in a case where the fixing tool has a metal shaft portion, wear on the inner peripheral surface of the through-hole due to friction against the shaft portion can be reduced compared to a case where a through-hole is defined in a resin portion. Furthermore, deformation of the inner peripheral surface of the through-hole due to force received from the shaft portion can be reduced.

In the noise suppression member described in the present specification, the fixing portion may be provided with a boss protruding in the same direction as a penetrating direction of the through-hole.

According to the noise suppression member thus configured, a fixing target place is provided with a hole or a concave portion into which the above-described boss is fitted. The boss is fitted into the hole or concave portion. Thus, the noise suppression member and the fixing target place can be roughly positioned. With the boss fitted into the hole or concave portion, relative position of the noise suppression member and the fixing target place is adjusted. With this process, the hole or concave portion of the fixing target place and the through-hole of the fixing portion can be easily overlapped. Then, the shaft portion of the fixing tool is inserted into the hole or concave portion of the fixing target place and the through-hole of the fixing portion. With this process, the boss prevents the fixing portion from rotating about the shaft portion relative to the fixing target place in fixing the fixing portion to the fixing target place with the fixing tool. Thus, the fixing portion can be efficiently positioned in attaching work compared to a case where the above-described boss is not provided. Furthermore, during and after attaching work, the fixing portion can be prevented from rotating about the shaft portion relative to the fixing target place.

In the noise suppression member described in the present specification, at least one of the first case part and the second case part may have a first region, a second region, and a third region in the circumferential direction about an axis being ab inserting direction of the electric wire. The engagement mechanisms may be disposed in the first region, the fixing portion may be disposed in the second region, and the third region may be in between the first region and the second region. Holes may be defined in the third region. The case part may be configured such that the third region is less rigid than the first region and the second region because of the holes defined in the third region.

According to the noise suppression member thus configured, in a case where a load is applied from the fixing tool side to the fixing portion in fixing the noise suppression member to the fixing target with the fixing portion, the case part is more readily deformed in the third region than in the first region and the second region. Thus, even in the case where the case part is deformed in the third region, deformation in the first region is reduced. This configuration can reduce effect of deformation of the case part on engagement of the engagement mechanisms.

The invention claimed is:

1. A noise suppression member comprising:
a first core part and a second core part; and
a first case part and a second case part;
the first core part and the second core part being configured to form an annular magnetic core by bringing the first core part and the second core part into contact with each other;
the first case part being configured to be able to house the first core part, and the second case part being configured to be able to house the second core part;
the first case part and the second case part including engagement mechanisms;
the engagement mechanisms each including an engaging portion and an engaged portion and being configured to fix the first case part and the second case part to each other by engaging the engaging portions with the respective engaged portions to bring the engagement mechanisms into an engaging state;
upon fixing the first case part and the second case part to each other with the engagement mechanisms, the first case part and the second case part are configured to maintain the first core part and the second core part in a state of forming the annular magnetic core, and the annular magnetic core is configured such that an electric wire is able to be placed on an inner peripheral side of the annular magnetic core;
when bringing the engagement mechanisms into the engaging state, the first core part and the second core part are configured to come into contact with each other before the engagement mechanisms are brought into the engaging state, and the engagement mechanisms are configured to be brought into the engaging state after the first core part and the second core part come into contact with each other;
the noise suppression member being configured to be fixed to a fixing target place with a fixing tool;
at least one of the first case part and the second case part including a fixing portion;
the fixing portion including a through-hole;
the fixing tool including a shaft portion;
the shaft portion being configured to be inserted into the through-hole;
the at least one case part including a first region, a second region, and a third region in a circumferential direction about an axis being an inserting direction of the electric wire;
the engagement mechanisms being disposed in the first region;
the fixing portion being disposed in the second region;
the third region being in between the first region and the second region;
holes being defined in the third region; and
the at least one case part being configured such that the third region is less rigid than the first region and the second region because of the holes defined in the third region, and upon external force acting on the fixing portion and upon a load acting on the at least one case part, the at least one case part being configured to reduce distortion in a vicinity of the engagement mechanisms by deforming in the third region.

2. The noise suppression member according to claim 1, wherein:
the fixing portion includes a resin portion and a metal portion;
the resin portion is formed integrally with the at least one case part;
the metal portion is fixed to the resin portion; and
the through-hole is defined in the metal portion.

3. The noise suppression member according to claim 1, wherein:
   the fixing portion includes a boss; and
   the boss protrudes in a same direction as a penetrating direction of the through-hole.

4. The noise suppression member according to claim 2, wherein:
   the fixing portion includes a boss; and
   the boss protrudes in a same direction as a penetrating direction of the through-hole.

\* \* \* \* \*